US012682413B2

(12) United States Patent
Kim et al.

(10) Patent No.: US 12,682,413 B2
(45) Date of Patent: Jul. 14, 2026

(54) SHARED VEHICLE DISPATCH SYSTEM AND METHOD

(71) Applicant: Hyundai Kefico Corporation, Gunpo (KR)

(72) Inventors: Ho Kyung Kim, Hwaseong (KR); Sil Lo Jin, Gunpo (KR); In Jae Kwak, Hwaseong (KR); Sang Hwan Oh, Hwaseong (KR); Sang Hoon Kim, Seoul (KR); Dae Woo Kim, Gunpo (KR); Nam Chul Paik, Anyang (KR); Hyeong Tae Noh, Gunpo (KR); Se Hee Byun, Seoul (KR)

(73) Assignee: Hyundai Kefico Corporation, Gunpo (KR)

( * ) Notice: Subject to any disclaimer, the term of this patent is extended or adjusted under 35 U.S.C. 154(b) by 122 days.

(21) Appl. No.: 18/707,361

(22) PCT Filed: Oct. 27, 2022

(86) PCT No.: PCT/KR2022/016626
§ 371 (c)(1),
(2) Date: May 3, 2024

(87) PCT Pub. No.: WO2023/080546
PCT Pub. Date: May 11, 2023

(65) Prior Publication Data
US 2025/0029197 A1      Jan. 23, 2025

(30) Foreign Application Priority Data
Nov. 5, 2021      (KR) ........................ 10-2021-0151553

(51) Int. Cl.
*G06Q 50/43* (2024.01)
*G01R 31/00* (2006.01)
(Continued)

(52) U.S. Cl.
CPC .......... *G06Q 50/43* (2024.01); *G01R 31/006* (2013.01); *G01R 31/382* (2019.01); *G07C 5/02* (2013.01);
(Continued)

(58) Field of Classification Search
CPC ........ G06Q 50/43; G06Q 30/06; G06Q 30/08; G06Q 50/40; G06Q 30/0619;
(Continued)

(56) References Cited

FOREIGN PATENT DOCUMENTS

JP           6183463  B2      8/2017
KR     10-2018-0105055  A      9/2018
(Continued)

*Primary Examiner* — Michael V Kerrigan
(74) *Attorney, Agent, or Firm* — Fox Rothschild LLP

(57) ABSTRACT

A shared vehicle dispatch system dispatches shared vehicles based on driver grades classified by learning user driving patterns, and a shared vehicle dispatch method uses the shared vehicle dispatch system. The shared vehicle dispatch system includes a shared vehicle having a vehicle controller configured to learn driving pattern information of a user, a user terminal, operated by the user, equipped with a dedicated application installed for requesting the dispatch of the shared vehicle, and an operation server communicating with the shared vehicle to receive the learned driving pattern information, where the operation server may determine a driver grade for the user who operated the shared vehicle based on the received driving pattern information.

7 Claims, 7 Drawing Sheets

(51) Int. Cl.

| | |
|---|---|
| *G01R 31/382* | (2019.01) |
| *G07C 5/02* | (2006.01) |
| *G07C 5/08* | (2006.01) |
| *B60L 58/12* | (2019.01) |
| *B60L 58/16* | (2019.01) |

(52) U.S. Cl.

CPC ............ *G07C 5/0808* (2013.01); *B60L 58/12* (2019.02); *B60L 58/16* (2019.02)

(58) Field of Classification Search

CPC .. G01R 31/006; G01R 31/382; G01R 31/371; G01R 31/392; G07C 5/02; G07C 5/0808; G07C 5/08; G07C 5/085; B60L 58/12; B60L 58/16; B60Y 2200/91

See application file for complete search history.

(56) References Cited

FOREIGN PATENT DOCUMENTS

| | | | |
|---|---|---|---|
| KR | 20210066597 A | * | 11/2019 |
| KR | 10-2020-0029790 A | | 3/2020 |
| KR | 10-2021-0066597 A | | 6/2021 |
| WO | 2019/176934 A1 | | 9/2019 |

* cited by examiner

FIG. 1

300 operation server control unit — 310 communication unit — 320 memory unit — 330 input/output (I/O) unit — 340

400 operator device control unit — 410 communication unit — 420 memory unit — 430 input/output (I/O) unit — 440

FIG. 4

SHARED VEHICLE DISPATCH SYSTEM AND METHOD

CROSS-REFERENCE TO RELATED APPLICATION(S)

The present application is a U.S. National Phase application under 35 U.S.C. § 371 of International Application No. PCT/KR2022/016626 filed on Oct. 27, 2022, which claims under 35 U.S.C. § 119(a) the benefit of Korean Application No. 10-2021-0151553 filed on Nov. 5, 2021, the entire contents of which are incorporated by reference herein.

BACKGROUND

(a) Technical Field

The present disclosure relates to a shared vehicle dispatch system that dispatches shared vehicles based on driver grades classified by learning user driving patterns, and a shared vehicle dispatch method using the same.

(b) Description of the Related Art

Battery life (also referred to as "State of Health" or "SOH") of an electric vehicle is affected by charging and discharging cycles and a discharge profile according to a driver's driving habits. Rapid acceleration leading to over-current usage, high current due to high-speed driving, and sustained high battery temperature conditions can accelerate the rapid aging of battery life (SOH).

Meanwhile, as the concept of sharing vehicles without ownership gradually spreads, there is an increasing trend in the number of platforms offering vehicle sharing services. Building on this trend, vehicle sharing services can utilize electric vehicles powered by batteries as shared vehicles.

Business operators or companies engaged in vehicle sharing services need to manage the batteries installed in shared vehicles to maximize their lifespan. However, as the business operates, the aging rate of the batteries installed in each shared vehicle will vary depending on the driving habits of the users who rent the shared vehicles. In other words, certain batteries may age faster.

SUMMARY

The present disclosure provides a shared vehicle dispatch system and method capable of reducing variations in the aging rate of shared vehicle batteries even when the driving patterns of each user who rents shared vehicles are different, which may increase profits of a business operator who runs a vehicle sharing business.

Furthermore, the present disclosure provides a shared vehicle dispatch system and method capable of preventing errors in estimating a driving range when dispatching shared vehicles to users.

In order to accomplish the above objects, a shared vehicle dispatch system based on electric vehicles according to an embodiment of the present disclosure includes a shared vehicle including a vehicle controller configured to learn driving pattern information of a user, a user terminal, operated by the user, equipped with a dedicated application installed for requesting the dispatch of the shared vehicle, and an operation server communicating with the shared vehicle to receive the learned driving pattern information, wherein the operation server determines a driver grade for the user who operated the shared vehicle based on the received driving pattern information.

Here, the vehicle controller may learn the driving pattern information using operational data related to vehicle speed or battery status during the operation of the shared vehicle, the driving pattern information including at least one of number of rapid accelerations, number of sudden decelerations, average driving speed, and battery state of charge (SOC) consumption.

Here, the operation server may assign a driving score to the user based on the driving pattern information received from the vehicle controller of the shared vehicle and classify the driver into one of at least two grades based on the assigned driving score.

In addition, the operation server, upon the shared vehicle being returned, may receive state of health (SOH) and SOC of the battery installed in the shared vehicle.

Meanwhile, a shared vehicle dispatch system based on electric vehicles according to an embodiment of the present disclosure may further include an operator device provided to a company engaging in a shared vehicle provisioning business to manage a plurality of shared vehicles, and communicating with the operation server to receive the determined driver grade, wherein the operator device, upon receiving a dispatch request from the user terminal, may match the driver grade received from the operation server and state of charge (SOC) of the battery installed in the shared vehicle, and dispatch the shared vehicle based on the matching result.

In addition, the operator device may match shared vehicles equipped with batteries having relatively higher SOH, among the available shared vehicles for dispatch, to driver grades corresponding to relatively lower driving scores, and shared vehicles equipped with batteries having relatively lower SOH to driver grades corresponding to relatively higher driving scores.

Meanwhile, the user terminal may provide a list of matched shared vehicles to the user through the application.

In order to accomplish the above objects, a shared vehicle dispatch method based on electric vehicles according to an embodiment of the present disclosure may include learning, at a vehicle controller installed in a shared vehicle, driving pattern information during the operation of the shared vehicle, determining, at an operation server receiving the driving pattern information, a driver grade for the user who operated the shared vehicle based on the received driving pattern information, and dispatching, at an operator device provided to a company engaging in a shared vehicle provisioning business to manage a plurality of shared vehicles, the shared vehicle based on the determined driver grade.

Here, the learning of driving pattern information may include learning the driving pattern information using operational data related to vehicle speed or battery status during the operation of the shared vehicle, the driving pattern information including at least one of number of rapid accelerations, number of sudden decelerations, average driving speed, and battery state of charge (SOC) consumption.

In addition, the determining of a driver grade may include assigning a driving score to the user based on the learned driving pattern information, and classifying the driver into one of at least two grades based on the assigned driving score.

In addition, the dispatching of the shared vehicle may include matching, upon receiving a dispatch request from the user terminal operated by the user, the classified driver grade and state of charge (SOC) of the battery installed in the shared vehicle, and dispatching the shared vehicle based on the matching result.

In addition, the dispatching of the shared vehicle may include matching shared vehicles equipped with batteries having relatively higher SOH, among the available shared vehicles for dispatch, to driver grades corresponding to relatively lower driving scores, and shared vehicles equipped with batteries having relatively lower SOH to driver grades corresponding to relatively higher driving scores.

In addition, the dispatching of the shared vehicle may include providing, at the user terminal, a list of the matched shared vehicles to dispatch the shared vehicle selected by the user.

The present disclosure is advantageous in terms of reducing the variation in the aging rate of shared vehicle batteries even when the driving patterns of each user who rents the shared vehicle are different, thereby increasing the profits of the business operator who runs the vehicle sharing business.

Additionally, the present disclosure is advantageous in terms of preventing errors in estimating the driving range when dispatching shared vehicle to users by dispatching shared vehicles equipped with batteries with relatively higher SOH to drivers with driving patterns that accelerate battery aging.

BRIEF DESCRIPTION OF THE DRAWINGS

FIG. 1 illustrates a configuration of a shared vehicle dispatch system according to an embodiment of the present disclosure;

FIG. 4 is a flowchart illustrating the detailed process of the learning stage in FIG. 3.

DETAILED DESCRIPTION

Figure 2A:
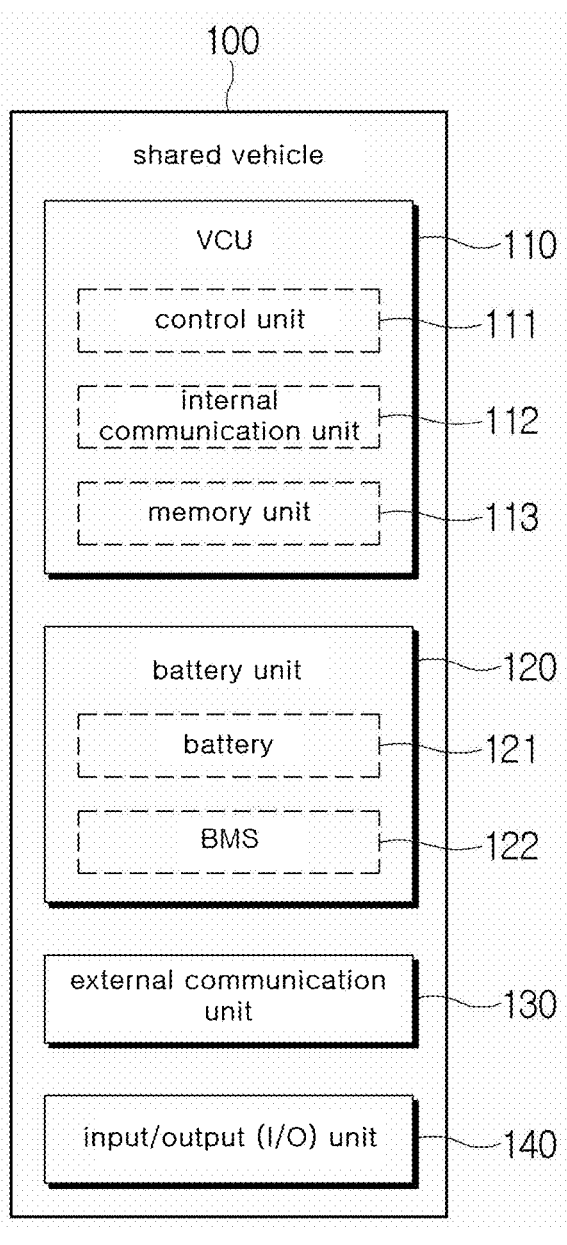
FIGS. 2A to 2D illustrate detailed configuration of each component of FIG. 1.

Hereinafter, an embodiment of the present disclosure will be described in detail with reference to the accompanying drawings.

The present disclosure can be implemented in diverse embodiments with various modifications, as specifically illustrated in the drawings and comprehensively described in the specification. However, such modifications and embodiments are not intended to limit the disclosure and should be construed including all changes, equivalents, and substitutes within the spirit and scope of the disclosure.

In describing the present disclosure, terms such as "first," "second," and the like may be used to refer to various components, but it should be understood that these terms are not intended to be limiting. The terms are used only for distinguishing one component from another component. For example, a first element may be referred to as a second element and, similarly, the second element may be referred to as the first element, without departing from the scope of the present disclosure.

The expression "and/or" is used to convey the possibility of including either a combination of multiple related listed items or any one of the related listed items.

When a component is referred to as being "connected to" or "coupled to" another component, it can imply that the two components are directly connected or coupled to each other, but it can also be understood that there may be other components in between them. In contrast, when a component is referred to as being "directly connected to" or "directly coupled to" another component, it can be understood that there is no intermediate component present between them.

The terminology used herein is for the purpose of describing particular embodiments only and is not intended to be limiting of the disclosure. The singular forms are intended to include the plural forms as well unless the context clearly indicates otherwise.

It will be further understood that the terms "comprises" or "has," when used in this specification, specify the presence of a stated feature, number, step, operation, component, element, or a combination thereof, but they do not preclude the presence or addition of one or more other features, numbers, steps, operations, components, elements, or combinations thereof.

Unless otherwise defined herein, all terms including technical or scientific terms used herein have the same meanings as commonly understood by those skilled in the art to which the present disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Furthermore, the following embodiments are provided to more fully explain the disclosure to those skilled in the art and may involve exaggerated shapes and sizes of components in the drawings for clearer illustration purposes.

Figure 1:
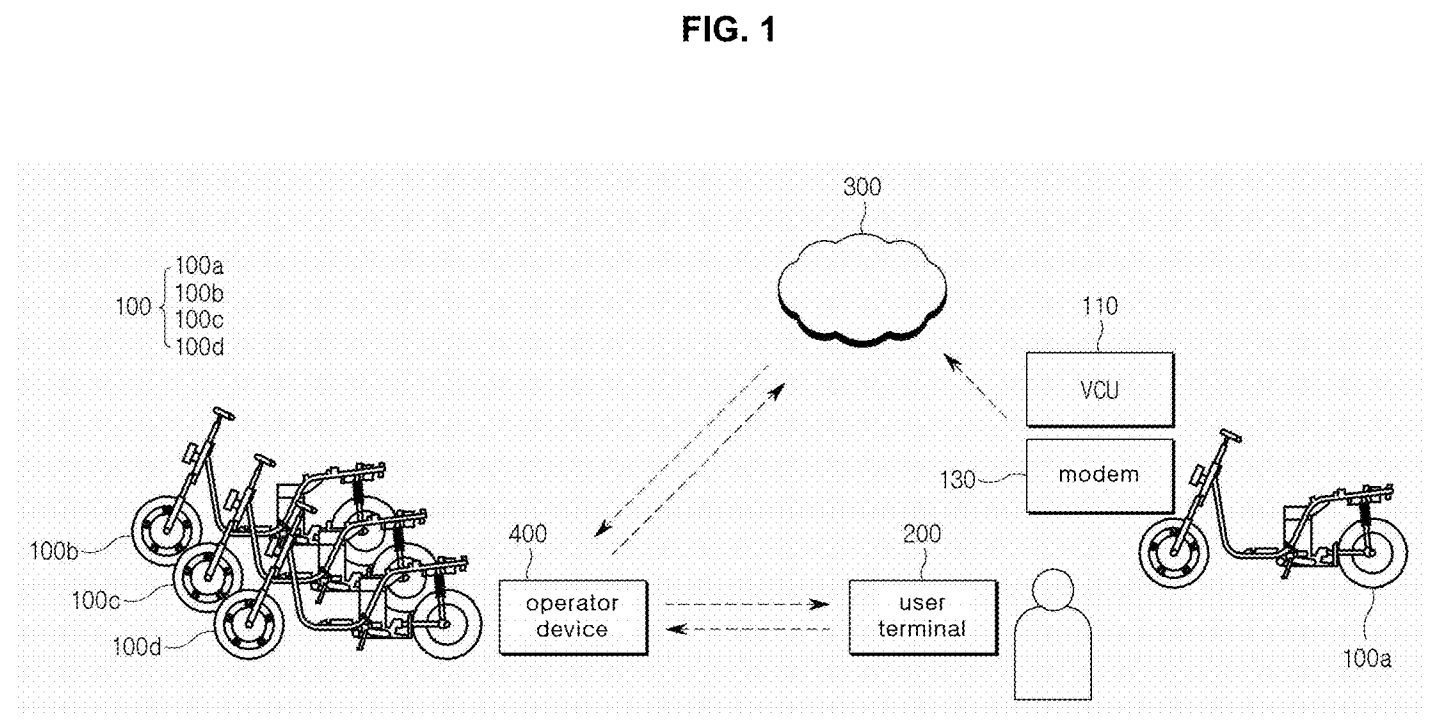
Figure 2B:
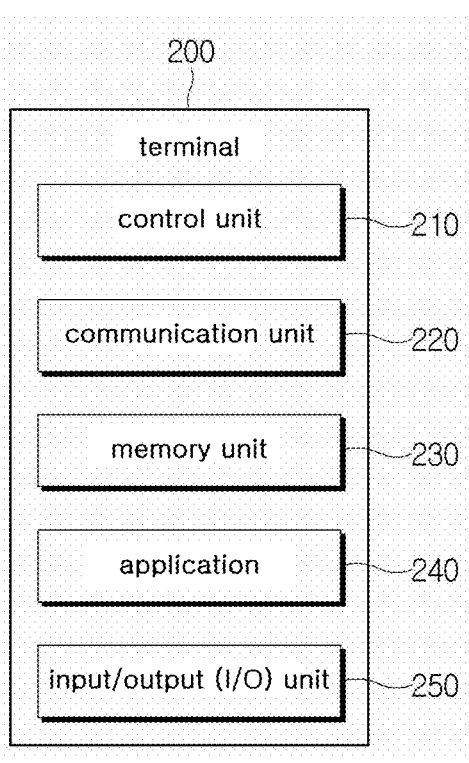
Figure 2C:
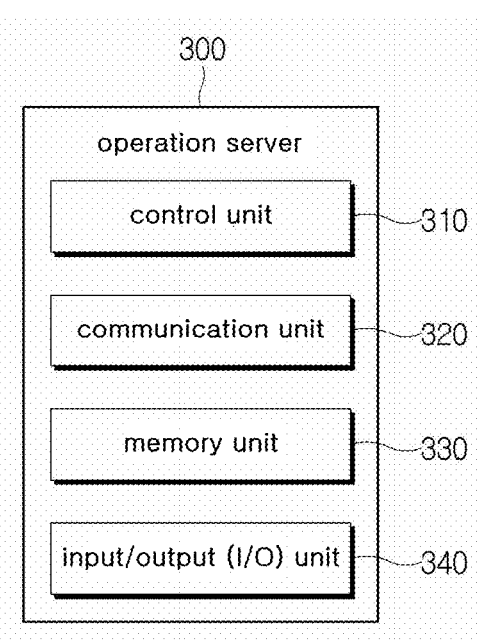
Figure 2D:
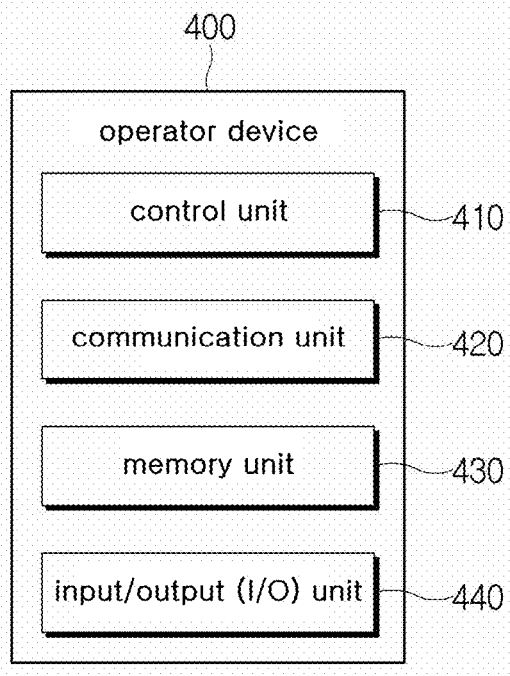

FIG. 1 illustrates a configuration of a shared vehicle dispatch system according to an embodiment of the present disclosure, and FIGS. 2A to 2C illustrate detailed configuration of each component of FIG. 1

With reference to FIGS. 1 and 2A to 2C, the shared vehicle dispatch system 1000 according to an embodiment of the present disclosure may include shared vehicles 100, a user terminal 200, and an operation server 300.

The shared vehicles 100, for example, may be electric two-wheeler, and a company engaged in vehicle sharing service to allow multiple users to share and use a single vehicle may manage and dispatch a plurality of shared vehicles 100a, 100b, 100c, and 100d.

The shared vehicles 100 may commence operation when users who have applied for the shared service perform user authentication. User authentication for the shared vehicles 100, for example, may be performed when a user applies for the shared service with the portable user terminal 200, and the operation server 300 conducts authentication using authentication keys assigned to both the user terminal 200 and the designated (dispatched) shared vehicle 100a.

In FIG. 1, reference number 100a represents a shared vehicle being dispatched and driven by a user, while reference numbers 100b to 100d represent shared vehicles awaiting dispatch.

Performing such user authentication allows the operation server 300 to manage and match users utilizing the shared service with the designated shared vehicle 100a and makes it possible to collect operational data when each user operates the shared vehicle 100a.

Meanwhile, the shared vehicles 100 may include a vehicle controller 110 and a battery unit 120.

The vehicle controller 110 may communicate with the battery unit 120 to receive status information about the battery installed in the shared vehicle 100. For this purpose, the vehicle controller 110 may be equipped with an internal communication unit 112 capable of communicating with the battery unit 120. For example, the communication may be conducted using controller area network (CAN) communication.

The status information of the battery may include the current state of charge (SOC) of the battery 121. The status information of the battery may also include the state of health (SOH), internal resistance values, and unique ID information of the battery. The status information of the battery may be collected by the battery management system (BMS) 122, and the vehicle controller 110 may receive the status information of the battery from the BMS 122.

The vehicle controller 110 may commonly be referred to as an electronic control unit (ECU), which is a general term for electronic control devices. The vehicle controller may also be referred to as a vehicle control unit (VCU). The vehicle controller 110 may include a control unit 111 enabling overall control of the configuration of the vehicle controller 110 and various electronic devices deployed in the shared vehicle 100. The control unit 111 may be any type of controller capable of executing computer program instructions, such as central processing unit (CPU), microcontroller unit (MCU), microcontroller, or microprocessor.

The vehicle controller 110 may communicate with the BMS 122 and other controllers (not shown) to collect various operational data.

For example, the operational data may include vehicle speed or battery-related information such as current speed, average speed, and battery status. This operational data may serve as the basis for the learning of driving patterns to be described later.

The vehicle controller 110 may further include a memory unit 113. The memory unit 113 may include volatile memory and nonvolatile memory. For example, the memory unit may include at least one of various storage media encompassing semiconductor memory such as random access memory (RAM), read only memory (ROM), and flash memory, magnetic disks, and optical disks. The memory unit 113 may be built into the vehicle controller 110 or installed separately from the vehicle controller 110.

The shared vehicle 100 may further include an external communication unit 130. The external communication unit 130 serves as a component capable of communicating with other components via wired and/or wireless connections, for example, communicating with the user terminal 200 and/or operation server 300 wirelessly. For example, the external communication unit 130 may be a modem.

The shared vehicle 100 may further include an input/output (I/O) unit 140. The input/output unit 140 may be configured to receive input from a user via an input/output interface (not shown). The input/output unit 140 may further include an output interface (not shown), such as a display for displaying information. For example, the input/output unit 140 may be positioned within the cluster of the shared vehicle.

The user terminal 200 refers to the device operated by users utilizing the shared service.

The user terminal 200 (hereinafter interchangeably referred to as 'terminal') may include a control unit 210, a communication unit 220, a memory unit 230, an input/output (I/O) unit 250, and an application 240.

The control unit 210 may control each component of the user terminal 200. The control unit 210 may be any type of controller capable of executing computer program instructions, such as central processing unit (CPU), microcontroller unit (MCU), microcontroller, or microprocessor.

For example, the control unit 210 may function as a communication module along with the communication unit 220, allowing control over the transmission and reception of information between the operation server 300. The communication unit is a component capable of communicating with other components via wired and/or wireless means.

Alternatively, for example, the control unit 210 may function as a memory module along with the memory unit 230 to control retrieving of data stored in the memory unit 230 or storing of new data. The memory unit 230 may include volatile memory and nonvolatile memory. For example, the memory unit may include at least one of various storage media encompassing semiconductor memory such as random access memory (RAM), read only memory (ROM), and flash memory, magnetic disks, and optical disks. The memory unit 230 may be built into the control unit 210 or installed separately from the control unit 210.

For example, the control unit 210 may also function as an input/output module along with the input/output unit 250, allowing control the input and output of data. The input/output module may perform input/output of various input and output signals. For example, the input/output unit 250 may be configured to receive input from a user via an input/output interface (not shown). The input/output unit 250 may further include an output interface (not shown), such as a display for displaying information.

Alternatively, for example, the control unit 210 may perform part of the shared vehicle dispatch method along with the application 240. For example, the control unit 210 may request vehicle dispatch through the application 240.

The control unit 210 may display notifications and information related to each operation described above through the application 240.

The operation server 300 may provide vehicle sharing services to users by integrating with electric vehicles equipped with batteries 121. The operation server 300 may include a control unit 310, a communication unit 320, a memory unit 330, and an input/output (I/O) unit 340.

The control unit 310 may control each component of the operation server 300. The control unit 310 may be any type of controller capable of executing computer program instructions, such as central processing unit (CPU), microcontroller unit (MCU), microcontroller, or microprocessor.

For example, the control unit 310 may function as a communication module along with the communication unit 320 to receive information from each shared vehicle 100a, 100b, 100c, and 100d.

Alternatively, for example, the control unit 310 may function as a memory module along with the memory unit 330 to control retrieving of data stored in the memory unit 330 or storing of new data. The memory unit 330 may include volatile memory and nonvolatile memory. For example, the memory unit may include at least one of various storage media encompassing semiconductor memory such as random access memory (RAM), read only memory (ROM), and flash memory, magnetic disks, and optical disks. The memory unit 330 may be built into the control unit 310 or installed separately from the control unit 310.

For example, the control unit 310 may also function as an input/output module along with the input/output unit 340, allowing control the input and output of data. The input/output module may perform input/output of various input and output signals. For example, the input/output unit 340 may be configured to receive input from administrators of the operation server 300 via an input/output interface (not shown). The input/output unit 340 may further include an output interface (not shown), such as a display for displaying information.

Meanwhile, the operation server 300 may be configured to operate based on cloud hosting.

According to an embodiment of the present disclosure, the shared vehicle dispatch system 1000 may further include an operator device 400.

For example, the operator device 400 may be a computing device located within the business premises, equipped to monitor and manage the plurality of shared vehicles 100*a*, 100*b*, 100*c*, and 100*d* based on the information received from the operation server 300. For example, the operator device 400 may be implemented as a separate business server distinct from the operation server 300.

The operator device 400 may include a control unit 410, a communication unit 420, a memory unit 430, and an input/output (I/O) unit 440.

The control unit 410 may control each component of the operator device 400. The control unit 410 may be any type of controller capable of executing computer program instructions, such as central processing unit (CPU), micro-controller unit (MCU), microcontroller, or microprocessor.

For example, the control unit 410 may function as a communication module along with the communication unit 420, allowing control over the transmission and reception of information between the operation server 300. The communication unit is a component capable of communicating with other components via wired and/or wireless means. For example, the communication module may communicate with the user terminal 200 to transmit a list of available shared vehicles for dispatch to the user terminal 200.

Alternatively, for example, the control unit 410 may function as a memory module along with the memory unit 430 to control retrieving of data stored in the memory unit 430 or storing of new data. The memory unit 430 may include volatile memory and nonvolatile memory. For example, the memory unit may include at least one of various storage media encompassing semiconductor memory such as random access memory (RAM), read only memory (ROM), and flash memory, magnetic disks, and optical disks. The memory unit 430 may be built into the control unit 410 or installed separately from the control unit 410.

For example, the control unit 410 may also function as an input/output module along with the input/output unit 440, allowing control the input and output of data. The input/output module may perform input/output of various input and output signals. For example, the input/output unit 440 may be configured to receive input from the operator via an input/output interface (not shown). The input/output unit 440 may further include an output interface (not shown), such as a display for displaying information. For example, the input/output module may display information indicative of the driver grade received from the operation server 300.

Hereinafter, a description is provided of the operation for the shared vehicle dispatch system 1000 to perform learning of driving patterns, classification of driver grades, and dispatch of shared vehicles 100 according to an embodiment of the present disclosure.

The vehicle controller 110 of the shared vehicle 100 may learn the driving pattern information of the user operating the shared vehicle 100. Here, the shared vehicle 100 refers to the shared vehicle 100*a* assigned to the user.

During the operation of the shared vehicle 100*a*, the vehicle controller 110 may learn the driving pattern information using operational data related to vehicle speed or battery status. The learned driving pattern information may include at least one of number of rapid accelerations, number of sudden decelerations, average driving speed, and SOC consumption of the battery.

The description is more elaborated hereinafter.

The vehicle controller 110 may monitor SOC, SOH, vehicle speed, driving time, driving distance, etc. Additionally, the vehicle controller 110 may track and store the maximum speed of the shared vehicle 100*a*.

The vehicle controller 110 may learn the number of rapid accelerations based on operational data. The number of rapid accelerations may be defined, for example, as the number of times the vehicle speed increases by more than 10% (reference increase rate) of the absolute value of the vehicle's maximum speed within 1 second (reference time) while driving 1 km. The vehicle controller 110 may monitor the number of rapid accelerations for each operation during a single rental of the shared vehicle 100*a* by the same user and learn and store the maximum value A among the number of rapid accelerations for each operation. When a user rented the shared vehicle 100*a* and made three trips, with 3 rapid accelerations in the first trip, 2 rapid accelerations in the second trip, and 5 rapid accelerations in the third trip, the number of rapid accelerations may be learned and stored as 5. Of course, the reference time and reference increase rate may be adjusted as needed.

The vehicle controller 110 may also learn the number of sudden decelerations based on operational data. The number of sudden decelerations may be defined, for example, as the number of times the vehicle speed decreases by more than 20% (reference decrease rate) of the absolute value of the vehicle's maximum speed within 1 second (reference time) while driving 1 km. The vehicle controller 110 may monitor the number of sudden decelerations for each operation during a single rental of the shared vehicle 100*a* by the same user and learn and store the maximum value B among the number of sudden decelerations for each operation. When a user rented the shared vehicle 100*a* and made three trips, with 2 sudden decelerations in the first trip, 4 sudden decelerations in the second trip, and 1 sudden deceleration in the third trip, the number of sudden decelerations may be learned and stored as 4. Of course, the reference time and decrease rate may be adjusted as needed.

The vehicle controller 110 may learn the average driving speed level (C) based on operational data. The average driving speed level may be defined as the ratio of the average speed during all operations to the maximum speed of the shared vehicle 100*a* during a single rental. The average driving speed level may be classified into three levels: low-speed (less than 60%), average-speed (60% or more but less than 80%), and high-speed (80% or more), depending on the size of the above ratio. However, the number of levels and the size of the reference ratio may vary as needed.

The vehicle controller 110 may also learn the battery SOC consumption (D) based on operational data. The battery SOC consumption (D) may be defined as the total amount of SOC used during a single rental of the shared vehicle 100*a*.

The vehicle controller 110 may transmit the learned driving pattern information to the operation server 300. This information is used as the basic data for the operation server 300 to classify driver grades. In addition, the vehicle controller 110 may transmit the final SOC and SOH of the battery to the operation server 300 when the user finishes driving and returns the shared vehicle 100*a*. This information is used as data for dispatching the shared vehicle 100*a* to the next user.

The operation server 300 may determine the driver grade of the user who operated the shared vehicle 100*a* based on the received driving pattern information. More specifically, the operation server 300 may assign a driving score to each user using the received driving pattern information.

The operation server 300 may assign driving scores based on the maximum values of rapid acceleration (A) and sudden deceleration (B). For example, when the maximum number of rapid accelerations (A) or sudden decelerations (B) is 0, 2 points may be assigned; when the maximum number is equal to or more than 1 and less than or equal to 5, 1 point may be assigned; and the maximum number is more than 5, 0 points may be assigned. This means that relatively higher scores are assigned for fewer occurrences of rapid acceleration or sudden deceleration, but the criteria and scores for assigning driving scores are examples and may be adjusted as needed.

The operation server 300 may also assign driving scores based on the average driving speed level (C). For example, when the average driving speed level (C) is categorized as low, 2 points may be assigned; when it is categorized as average, 1 point may be assigned; and when it is categorized as high, 0 points may be assigned. That is, the closer the average driving speed level (C) is to low-speed, the higher the relative score is assigned, but the number of steps serving as criteria for assigning driving scores and the scores themselves are examples and may be adjusted as needed.

The operation server 300 may also assign driving scores based on the battery SOC consumption (D). For example, short-distance drivers (using SOC of 40% or less) may be assigned 2 points, regular drivers (using SOC of 40% or more and less than 70%) may be assigned 1 point, and long-distance drivers (using SOC of more than 70% to complete discharge) may be assigned 0 points. This means that relatively higher scores are assigned for short-distance drivers using relatively lower SOC, but the SOC usage ratio serving as the criteria for assigning driving scores is an example and may be adjusted as needed.

The operation server 300 may classify driver grades based on the assigned driving scores. In detail, the operation server 300 may classify driver grades into at least two grades based on the total sum of the driving scores For example, when the driving score is equal to or higher than 6, the operation server 300 may classify the driver as a "Mild" grade driver.

For example, when the driving score is equal to or higher than 3 and less than or equal to 5, the operation server 300 may classify the driver as a "Mid" grade driver.

For example, when the driving score is less than or equal to 2, the operation server 300 may classify the driver as a "Heavy" grade driver.

That is, users classified as "Heavy" grade drivers, with lower aggregated driving scores, exhibit rough driving habits that accelerate the aging of electric vehicle batteries and are classified into the "Heavy" grade driver grade. For users classified with this driver grade, it is necessary to deploy vehicles in such a way as to minimize differences in battery aging levels among the plurality of shared vehicles 100*a*, 100*b*, 100*c*, and 100*d*. Further explanation on this matter will be provided subsequently.

The user of the vehicle sharing service may request the dispatch of a shared vehicle 100 using the user terminal 200. Upon receiving the dispatch request, the operator device 400 may communicate with the operation server 300 to obtain the determined driver grade of the user who made the dispatch request. The operation server 300 may determine and update the driver grade for each user renting a shared vehicle 100 and may store the driver grade. That is, the operation server 300 may store the driver grade of each user subscribed to the vehicle sharing service.

Upon receiving a vehicle dispatch request from the user terminal 200, the operator device 400 may match the received user's classified driver grade with the SOH of the battery installed in the shared vehicle 100, and based on this matching result, dispatch the shared vehicle 100.

Prior to this, SOC conditions may be matched first. Users of the vehicle sharing service may input the destination or target driving distance information into the user terminal 200, which is transmitted along with the request for the dispatch of a shared vehicle 100. Based on this information, the operator device 400 may dispatch a shared vehicle 100 equipped with a battery that has SOC sufficient to travel to the destination or cover the target driving distance.

However, solely relying on SOC for dispatching shared vehicles may pose issues. This is because the driving range of electric vehicles is typically calculated based on SOC, but SOH of the battery also influences the driving range. That is, even though a shared vehicle 100 meeting the SOC criteria is dispatched, when the battery installed in the shared vehicle has a low SOH due to aging, the battery may discharge quickly, resulting in the user being unable to travel the expected target driving distance.

Furthermore, heavy-grade drivers, known for their habit of repeated rapid accelerations and decelerations, may drive at lower efficiency, and when such users are assigned shared vehicles 100 with batteries having low SOH, this may exacerbate the discrepancy between the target and actual driving distances.

Therefore, the present disclosure proposes a system that further considers SOH in dispatching shared vehicles 100 by matching SOH with driver grades.

In more detail, the operator device 400 may match the shared vehicles equipped with batteries having relatively higher SOH among the available shared vehicles for dispatch to driver grades corresponding to relatively lower driving scores.

The operator device 400 may match the shared vehicles equipped with batteries having relatively lower SOH among the available shared vehicles for dispatch to driver grades corresponding to relatively higher driving scores.

In this case, the available shared vehicles for dispatch may refer to shared vehicles that meet the SOC conditions among all shared vehicles 100*a*, 100*b*, 100*c*, and 100*d* awaiting dispatch.

For example, in an embodiment where driver grades are classified into the aforementioned three categories (Heavy, Mid, and Mild) based on driving scores, the Heavy driver grade, corresponding to relatively lower driving scores, may be matched with shared vehicles equipped with batteries in the top 70% of SOH. However, the figure of 70% is exemplary and may be adjusted as needed.

The Mild driver grade, corresponding to relatively higher driving scores, may be matched with shared vehicles equipped with batteries in the bottom 70% of SOH. However, the figure of 70% is exemplary and may be adjusted as needed.

In this manner, users who are more likely to drive with lower efficiency may be matched with vehicles equipped with batteries with relatively lower aging, while users who are more likely to drive with higher efficiency may be matched with vehicles equipped with batteries with relatively higher aging, thus preventing errors in estimating driving range that may arise from discrepancies between target and actual driving distances.

Moreover, this matching approach may reduce variations in battery aging among shared vehicles 100, ultimately leading to a decrease in battery replacement costs and increasing profitability for the operator.

The Mid driver grade, classified as having little impact on battery degradation during operation, may be matched with all available shared vehicles for dispatch.

Meanwhile, the operator device 400 may transmit the list of matched shared vehicles to the user terminal. The user may check the list of matched shared vehicles through the application 250 on the user terminal 200 and select the desired shared vehicle, thereby completing the dispatch.

Once the dispatch is complete, the operator device 400 may transmit the information of the dispatched shared vehicle 100*a* (such as ID) and the user information (such as name and contact) to the operation server 300, and the operation server 300 may then update the driver grade while the user operates the dispatched shared vehicle 100*a*.

Hereinafter, a description is made of the shared vehicle dispatch method according to an embodiment of the present disclosure.

Figure 3:
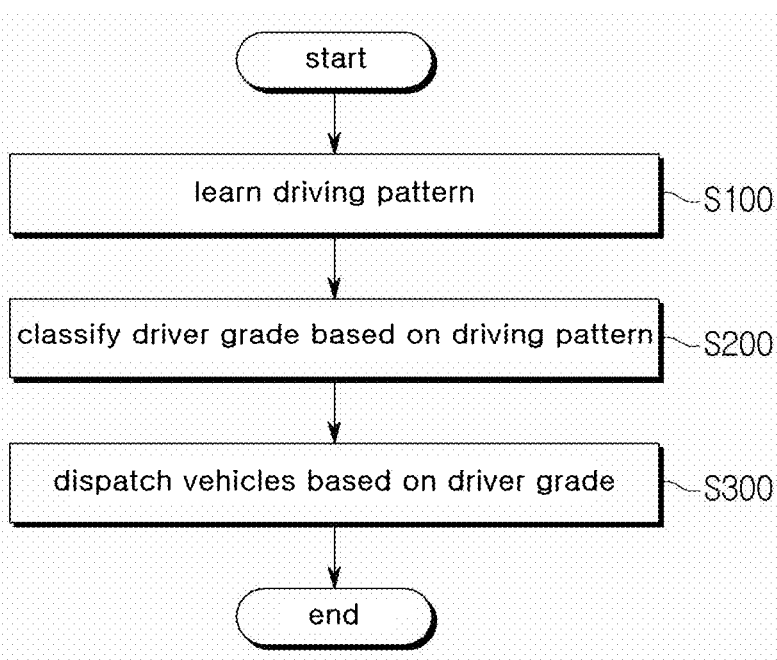
FIG. 3 is a flowchart illustrating the process of a shared vehicle dispatch method according to an embodiment of the present disclosure.
Figure 4:
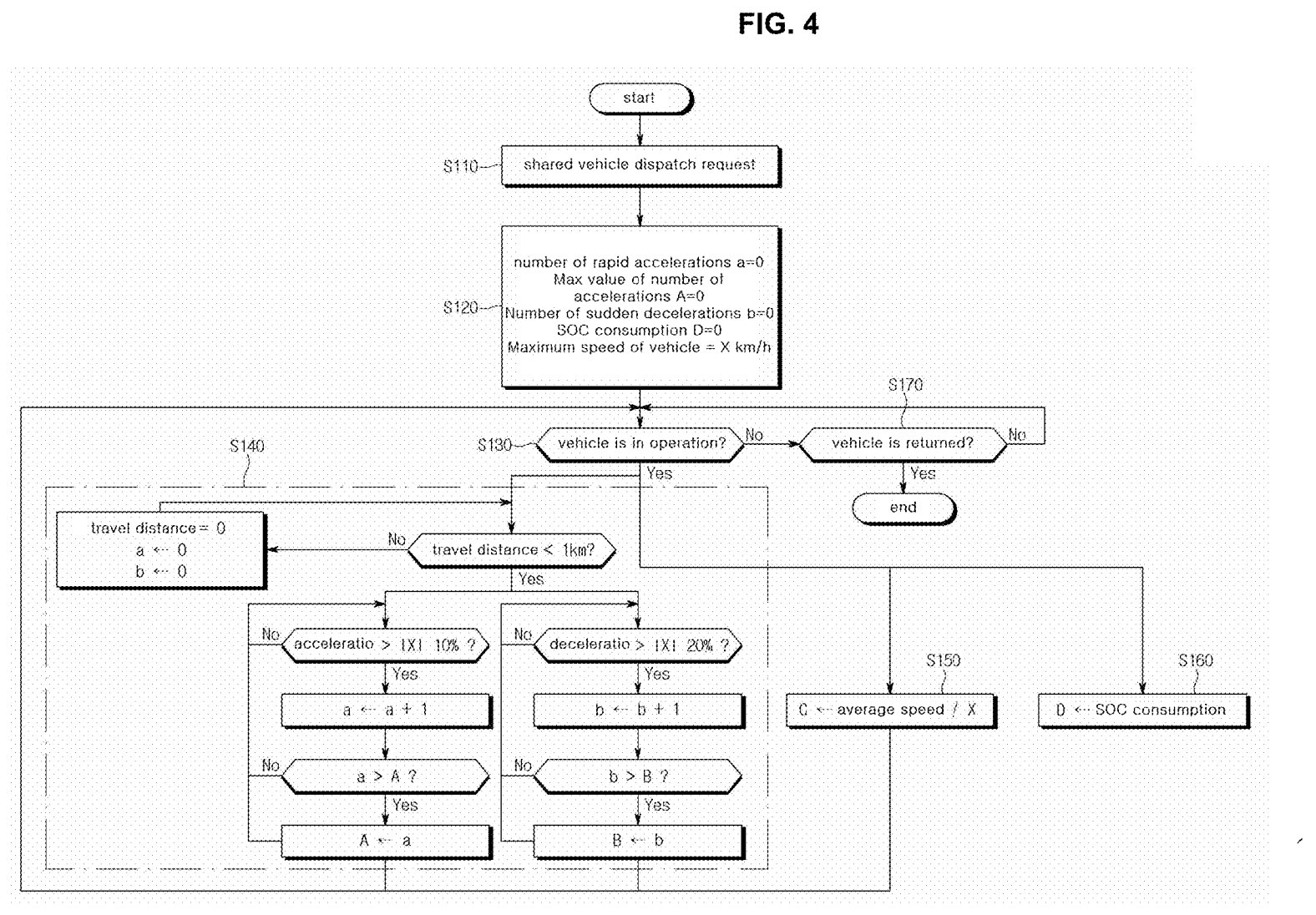
Figure 5:
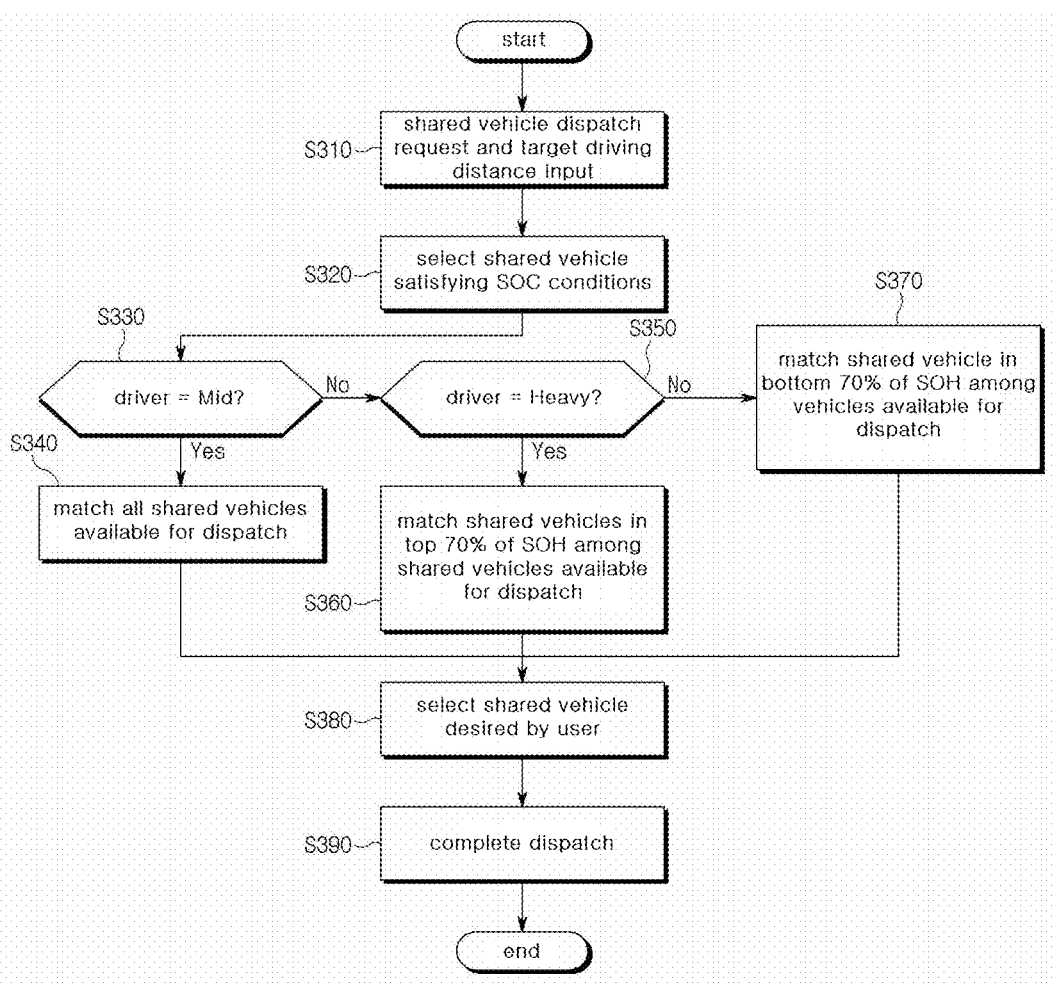
FIG. 5 is a flowchart illustrating the detailed process of the dispatch stage in FIG. 3.

FIG. 3 is a flowchart illustrating the process of a shared vehicle dispatch method according to an embodiment of the present disclosure, FIG. 4 is a flowchart illustrating the detailed process of the learning stage in FIG. 3, and FIG. 5 is a flowchart illustrating the detailed process of the dispatch stage in FIG. 3.

According to an embodiment of the present disclosure, the shared vehicle dispatch method may be executed by the shared vehicle dispatch system 1000.

With reference to FIGS. 3 to 5, the shared vehicle dispatch method according to an embodiment of the present disclosure may include learning stage S100, grade determination stage S200, and dispatch stage S300.

In the learning stage S100, the vehicle controller 110 installed in the shared vehicle 100*a* learns the driving pattern information during the operation of the shared vehicle 100*a*.

Hereinafter, a description is made of stage S100 in more detail by sequence.

First, the user is assigned the shared vehicle 100*a*.

The vehicle controller 110 of the shared vehicle 100*a* may reset the operation data for new data collection. For example, the vehicle controller 110 may initialize the previously stored operation data of the previous user in the memory unit 113, including the number of rapid accelerations (a), maximum number of rapid accelerations (A), number of sudden decelerations (b), maximum number of sudden decelerations (B), average driving speed level (C), and battery SOC usage (D) to 0. The maximum speed (X) of the shared vehicle 100*a* is a predetermined value and is used as stored.

When the user starts driving the shared vehicle 100*a*, the vehicle controller 110 learns the driving pattern information using the operation data.

The sub-steps of step S140 in FIG. 4 represents a sequence of learning driving pattern information using the number of rapid accelerations (a) and the number of sudden decelerations (b). Since this has been previously explained in detail, redundant explanations will be omitted here.

In FIG. 4, step S150 represents a sequence of learning the average driving speed level (C), and step S160 represents a sequence of learning the battery SOC usage (D). Since these have been previously explained in detail, redundant explanations will be omitted here.

The learning of driving pattern information is repeated until the user stops driving the shared vehicle 100*a* and returns the vehicle to the operator.

In the grade determination stage S200, the operation server 300, received the driving pattern information from the vehicle controller 110, determines the driver grade of the user who operated the shared vehicle 100*a* based on the driving pattern information.

More specifically, in stage S200, the operation server 300 may assign a driving score to each user based on the learned driving pattern information and classify the driver grade into at least two grades based on the assigned driving scores.

The detailed description of the assignment of driver grades by the operation server 300 in stage S200 may be substituted with the earlier description of classifying driver grades into Heavy, Mid, and Mild grades in the above embodiment.

In the dispatch stage S300, the operator device 400 matches the determined driver grade with the SOH of the battery installed in the shared vehicle 100 to dispatch the shared vehicle 100.

Stage S300 is performed for users who have a history of being assigned and operating shared vehicles and whose driver grades have been classified.

Hereinafter, a description is made of stage S300 in more detail by sequence.

First, the user requests the dispatch of a shared vehicle 100 using the application 240 on the mobile terminal 200. This dispatch request may be sent to the operator device 400. Here, the user may input the target driving distance or destination through the application 240 to transmit relevant information regarding the dispatch request to the operator device 400.

Next, the operator device 400 may determine shared vehicle available for dispatch among all shared vehicles 100*a*, 100*b*, 100*c*, and 100*d* awaiting dispatch. Here, shared vehicle available for dispatch refer to the shared vehicle that meet the SOC conditions to cover the target driving distance.

Next, the operator device 400 may match the classified driver grades with the SOH of the batteries installed in the shared vehicles that satisfy the SOC conditions.

In more detail, it may be possible to match the shared vehicles equipped with batteries having relatively higher SOH among the available shared vehicles for dispatch to driver grades corresponding to relatively lower driving scores, and the shared vehicles equipped with batteries having relatively lower SOC to driver grades corresponding to relatively higher driving scores.

For example, in an embodiment where driver grades are classified into the aforementioned three categories (Heavy, Mid, and Mild) based on driving scores, the Heavy driver grade, corresponding to relatively lower driving scores, may be matched with shared vehicles equipped with batteries in the top 70% of SOH (S350 and S360). However, the figure of 70% is exemplary and may be adjusted as needed.

The Mild driver grade, corresponding to relatively higher driving scores, may be matched with shared vehicles equipped with batteries in the bottom 70% of SOH (S370). However, the figure of 70% is exemplary and may be adjusted as needed.

The Mid driver grade, classified as having little impact on battery degradation during operation, may be matched with all available shared vehicles for dispatch (S330 and S340).

Meanwhile, the operator device 400 may transmit the list of matched shared vehicles to the user terminal 200. The user may check the list of matched shared vehicles through the application 240 on the user terminal 200 and select the desired shared vehicle, thereby completing the dispatch (S380 and S390).

More detailed description of the shared vehicle dispatch method according to an embodiment of the present disclosure may be substituted with the earlier description of the shared vehicle dispatch system 1000.

As described above, the present disclosure is capable of reducing the variation in the aging rate of shared vehicle batteries even when the driving patterns of each user who rents the shared vehicle are different in such a way as to classifying driver grades based on driving patterns and match the driver grades with the lifespan of batteries installed in shared vehicles, thereby increasing the profits of the business operator who runs the vehicle sharing business.

Additionally, the present disclosure is advantageous in terms of preventing errors in estimating the driving range when dispatching shared vehicle to users by dispatching shared vehicles equipped with batteries with relatively higher SOH to drivers with driving patterns that accelerate battery aging.

Meanwhile, although the present disclosure has been described with specific embodiments and drawings, the present disclosure is not limited to the above embodiments, and various modifications and variations can be made from these descriptions by those skilled in the art. Therefore, the technical spirit of the present disclosure should be determined solely by the claims, and all fair or equivalent modifications thereof would be considered within the scope of the technical concept of the present disclosure.

What is claimed is:

1. A shared vehicle dispatch system for electric vehicles, the system comprising:

a shared vehicle comprising a vehicle controller configured to learn driving pattern information of a user;

a user terminal, operated by the user, equipped with a dedicated application installed for requesting dispatch of the shared vehicle; and an operation server communicating with the shared vehicle to receive the learned driving pattern information, and wherein the operation server determines a driver grade for the user who operated the shared vehicle based on the received driving pattern information;

wherein the vehicle controller learns the driving pattern information using operational data related to vehicle speed or battery status during the operation of the shared vehicle, the driving pattern information comprising at least one of a number of rapid accelerations, a number of sudden decelerations, an average driving speed, and a battery state of charge (SOC) consumption, and wherein the operation server assigns a driving score to the user based on the driving pattern information received from the vehicle controller of the shared vehicle and classifies the driver into one of at least two grades based on the assigned driving score; and an operator device provided to a company engaging in a shared vehicle provisioning business to manage a plurality of shared vehicles, and communicating with the operation server to receive the determined driver grade, wherein the operator device, upon receiving a dispatch request from the user terminal, matches the driver grade received from the operation server and state of charge (SOC) of the battery installed in the shared vehicle, and dispatches the shared vehicle based on the matching result.

2. The system of claim 1, wherein the operation server, upon the shared vehicle being returned, receives state of health (SOH) and SOC of the battery installed in the shared vehicle.

3. The system of claim 1, wherein the operator device matches shared vehicles equipped with batteries having relatively higher SOH, among the available shared vehicles for dispatch, to driver grades corresponding to relatively lower driving scores, and shared vehicles equipped with batteries having relatively lower SOH to driver grades corresponding to relatively higher driving scores.

4. The system of claim 3, wherein the user terminal provides a list of matched shared vehicles to the user through the application.

5. A shared vehicle dispatch method for electric vehicles, the method comprising:

learning, at a vehicle controller installed in a shared vehicle, driving pattern information during operation of the shared vehicle;

determining, at an operation server receiving the driving pattern information, a driver grade for the user who operated the shared vehicle based on the received driving pattern information; and dispatching, at an operator device provided to a company engaging in a shared vehicle provisioning business to manage a plurality of shared vehicles, the shared vehicle based on the determined driver grade;

wherein the learning of driving patter information comprises learning the driving pattern information using operational data related to vehicle speed or battery status during the operation of the shared vehicle, the driving pattern information comprising at least one of number of rapid accelerations, number of sodden deceleration, average driving speed, and battery state of charge (SOC) consumption;

wherein the determining of a driver grade comprises:

assigning a driving score to the user based on the learned driving pattern information; and classifying the driver into one of at least two grades based on the assigned driving score; and wherein the dispatching of the shared vehicle comprises:

matching, upon receiving a dispatch request from a user terminal operated by the user, the classified driver grade and state of charge (SOC) of the battery installed in the shared vehicle; and dispatching the shared vehicle based on the matching result.

6. The method of claim 5, wherein the dispatching of the shared vehicle comprises matching shared vehicles equipped with batteries having relatively higher SOH, among the available shared vehicles for dispatch, to driver grades corresponding to relatively lower driving scores, and shared vehicles equipped with batteries having relatively lower SOH to driver grades corresponding to relatively higher driving scores.

7. The method of claim 6, wherein the dispatching of the shared vehicle comprises providing, at the user terminal, a list of the matched shared vehicles to dispatch the shared vehicle selected by the user.

* * * * *